June 4, 1957 J. A. DOREMUS 2,794,957

FREQUENCY MODULATOR

Filed Dec. 13, 1952

INVENTOR.

John A. Doremus

BY Norman L. Mueller

Atty.

2,794,957
Patented June 4, 1957

2,794,957

FREQUENCY MODULATOR

John A. Doremus, Chicago, Ill., assignor to Motorola, Inc., Chicago, Ill., a corporation of Illinois Application December 13, 1952, Serial No. 325,824

2 Claims. (Cl. 332—28)

The present invention relates to electron tube oscillator circuits and more particularly to a variable frequency oscillator circuit and the control means for varying the frequency of the oscillator circuit.

The use of reactive elements such as variable condensers and inductors for changing the tuning of oscillator resonant circuits is well known. However, in many applications it is desired to provide variable tuning without the use of a manually movable element. The use of an electron tube as a variable reactance (reactance tubes), is also known but tubes suitable for this purpose are relatively expensive and the overall circuit is generally complicated. Further, the amount of frequency variation obtainable by such tube means is quite limited.

An object of the present invention is to provide a variable frequency oscillator having oscillator frequency determining reactance means electrically connected in a circuit together with improved means to vary the reactive effect of said reactance means on the oscillator circuit to thereby variably control the frequency of the oscillator.

Another object of the invention is to provide a variable frequency oscillator having a tuned oscillator circuit and a capacitive reactance device coupled to the tuned circuit for controlling the resonant frequency thereof, with electrical means to vary the reactive effect of said device on the tuned oscillator circuit without changing the actual capacity of the device to thereby variably control the frequency of the oscillator circuit.

A further object of the invention is to provide a variable frequency oscillator circuit having electrical means to control the oscillator frequency in a manner to facilitate an electrical modulation of the oscillator frequency in response to modulation signals.

A feature of the invention is the provision in an electron tube oscillator circuit including a resonant coil and capacitor tank circuit, of a series connected condenser and impedance connected in parallel with the resonant circuit, one electrode of the condenser being connected to the oscillator signal voltage of the oscillator circuit, the other electrode of the condenser being also connected to a second signal voltage of variably controlled amplitude and the same instantaneous phase as the oscillating signal, whereby the reactive effect of the condenser on the resonant circuit may be variably controlled to vary the oscillator signal frequency.

Another feature of the invention is the provision of a variable gain amplifier circuit connected to the oscillator signal voltage for producing a second signal voltage of variably controlled amplitude and the same instantaneous phase as the oscillator signal voltage for application as the second signal voltage to control the reactive effect of the condenser in the manner mentioned in the preceding paragraph.

A further feature of the invention is the provision of an oscillator having a resonant or tank circuit with an auxiliary circuit bridged therecross including a condenser, and an amplifier circuit having the input and output thereof respectively connected to the terminals of the condenser, the gain of the amplifier being variable to control the voltage across the condenser with the voltage at the two trminals thereof being maintained in the same instantaneous phase, whereby said auxiliary circuit controls the frequency of said oscillator in accordance with the gain of said amplifier.

Further objects, features and the attending advantages of the invention will be apparent with reference to the following specification and drawing in which.

In practicing the invention an oscillator is provided which may be a modified form of the Hartley oscillator circuit or any other known oscillator circuit. A series connected condenser and impedance is connected across the resonant circuit of the oscillator in a manner such that the oscillator signal frequency is applied to one electrode of the condenser. The oscillator signal frequency is also connected to a variable gain amplifier to produce a second signal of variable amplitude and the same instantaneous phase as the oscillator signal. The second signal is connected to the other electrode of the condenser and its amplitude thereby determines the reactive effect of the condenser on the resonant circuit of the oscillator to variably control the oscillator frequency. In one embodiment of the invention the variable gain amplifier may be a simple form of two stage resistance coupled electron tube circuit such that the output signal is of the same instantaneous phase as the input signal. In another embodiment of the invention, the variable gain amplifier may be a cathode follower electron tube stage with the signal at the cathode of the amplifier being of the same instantaneous phase as the input signal applied to the grid thereof. In yet another embodiment of the invention the gain of a multi-stage electron tube amplifier circuit is electrically controlled by a modulation signal applied to bias a tube in one of the amplifier stages whereby the oscillator circuit may be frequency modulated.

Figure 1:
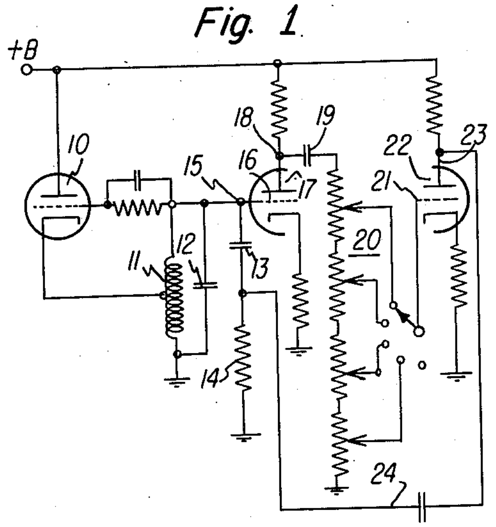
Fig. 1 is a schematic diagram of one form of variable frequency oscillator circuit of the invention.

Referring to Fig. 1 of the drawings, the triode tube 10 is connected in a modified form of Hartley oscillator circuit including the inductance 11 and fixed condenser 12. The inductance 11 and condenser 12 constitute what may be generally referred to as a tank circuit. Since the values of the inductance 11 and condenser 12 are fixed as shown in Fig. 1, the oscillator signal frequency is generally determined by such fixed values. However, according to the present invention, a condenser 13 is connected in series with a low resistance impedance device 14, which together are connected in parallel with the oscillator tank circuit including the inductance 11 and condenser 12. The reactive effect of the condenser 13 thereby changes the oscillator signal frequency to a value which is generally determined by the relative values of the condensers 12 and 13 in the circuit.

According to the invention, the reactive effect of the condenser 13 on the oscillating circuit may be electrically varied to variably control the oscillator frequency. The oscillator signal at the point 15 is applied to the upper electrode of the condenser 13 and is also applied to the control grid 16 of a triode amplifier tube 17. The output signal at the plate 18 of the triode amplifier tube 17 is connected by the coupling condenser 19 and a step attenuator generally shown at 20 to the control grid 21 of the second triode amplifier tube 22. The output signal at the plate 23 of the triode amplifier tube 22 is connected by line 24 to the lower electrode of the condenser 13.

When the step attenuator 20 is adjusted to provide unity gain for the resistance coupled amplifier circuit including triode tubes 17 and 22, the second signal voltage in line 24 will be of the same amplitude and the same instantaneous phase as the oscillator signal voltage at point 15, which is connected to the upper electrode of the condenser 13. Therefore, under such conditions of operation, the instantaneous value of the potential on both the electrodes of the condenser 13 is of the same phase and of equal amplitude so that the reactance of the condenser 13 on the oscillating circuit is effectively zero. By adjusting the step attenuator 20 to provide less than unity gain for the resistance coupled amplifier, the condenser 13 will have a capacitive reactance effect upon the oscillating circuit to a degree determined by the gain adjustment of the amplifier. With the step attenuator 20 adjusted to provide no signal output at the plate electrode 23 and in line 24, the maximum capacitive reactance of the condenser 13 will be connected in the oscillator circuit to lower the oscillator signal frequency.

Under another condition of operation, with the step attenuator 20 adjusted to provide more than unity gain for the resistance coupled amplifier circuit, the condenser 13 has a negative capacity effect upon the oscillating circuit to increase the oscillator frequency above the normal frequency which would be obtained with the fixed values of the inductance 11 and condenser 12. It is to be pointed out that the gain of the amplifier circuit must not be so great that oscillations may occur therein.

Figure 2:
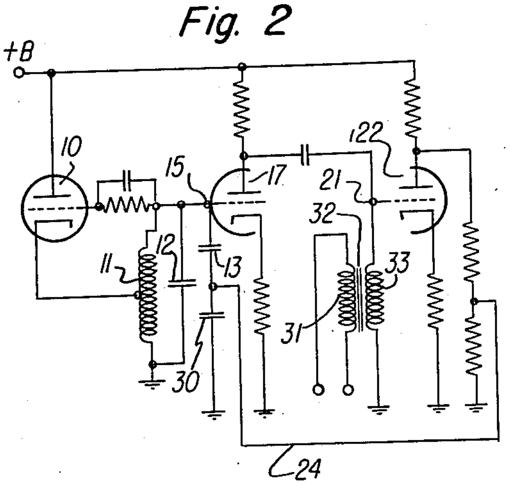
Fig. 2 is a schematic diagram of a modified form of the circuit of Fig. 1 as adapted for frequency modulation by an electric modulation signal.

A modified arrangement of the invention similar to that just described in Fig. 1 of the drawings is shown in Fig. 2 of the drawings. In this arrangement the condenser 13 is connected in series with an impedance device which may be another condenser as shown at 30 instead of the low resistance impedance device 14 shown in Fig. 1. The gain of the resistance coupled amplifier including the triode tubes 17 and 22, is controlled by an electric modulation signal applied to the primary winding 31 of the transformer 32 whose secondary winding 33 is connected to the control grid 21 of the second or intermediate triode amplifier tube 22. In such manner, the amplifier tube 22 is biased to vary the gain of the amplifier in accordance with the electric modulation signal applied to the primary winding 31. The second signal having the same instantaneous phase as the oscillator signal voltage is connected by line 24 to the lower electrode of the condenser 13 and the operation of the circuit is the same as that previously described in Fig. 1, except that the frequency of the oscillator circuit is determined by the electric modulation signal which may, if desired, be an audio frequency signal.

Figure 3:
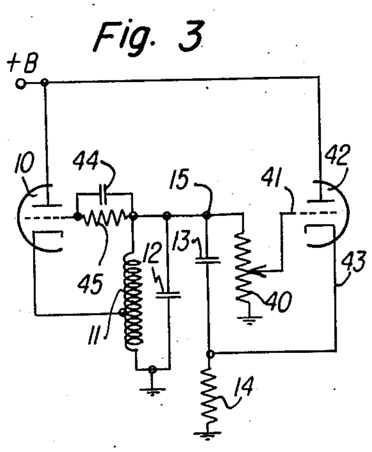
Fig. 3 is a schematic diagram of a modified form of the invention shown in Fig. 1.

A simplified embodiment of the invention is shown in Fig. 3 of the drawings. The oscillator including the tube 10, coil 11, condensers 12 and 13, the resistor 14 are the same as in Fig. 1. The grid of the tube 10 is connected to the tuned circuit through resistor 45, bypassed by condenser 44. The oscillator signal voltage at the point 15 is connected through potentiometer 40 to the control grid 41 of a triode amplifier tube 42 connected in a cathode follower amplifier circuit. The signal at the cathode of the amplifier tube 42 is connected by line 43 to the lower electrode of the condenser 13. In such an arrangement, using a cathode follower amplifier circuit, it is not possible to adjust the amplifier circuit to have unity gain, and there will therefore always be a slight amount of reactive effect of the condenser 13 on the oscillator circuit, even with the maximum amplitude of the oscillator signal at point 15 connected to the control grid 41. By adjusting the potentiometer 40 to reduce the amplitude of the signal applied to the control grid 41, the second signal voltage in the line 43 for application to the lower electrode of the condenser 13 may be reduced to zero to apply the full reactive effect of the condenser 13 on the oscillator circuit and lower the oscillator frequency.

The circuit of Fig. 3 has been found to be highly satisfactory and the following values have been used in a model which operated successfully to provide frequency modulation in which the frequency varied between 1200 cycles and 1400 cycles per second. In this circuit the following components were used.

| | | |
|---|---|---|
| Tubes 10 and 42 | | 12AU7 |
| Inductor 11 | henry | 1 |
| Condenser 12 | microfarad | .01 |
| Condenser 13 | do | .01 |
| Resistor 14 | ohms | 10,000 |
| Potentiometer 40 | megohms | 2 |
| Condenser 44 | microfarad | .001 |
| Resistor 45 | ohms | 100,000 |

Figure 4:
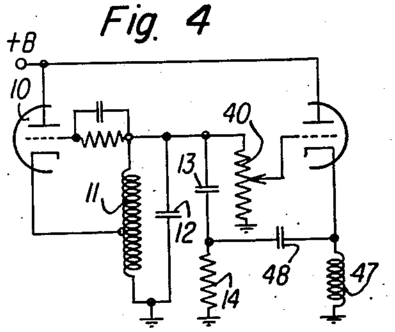
Fig. 4 is a schematic diagram of another embodiment of the invention.

A modified version of the circuit of Fig. 3 is shown in Fig. 4. This circuit is exactly the same as in Fig. 3 except that the cathode of tube 42 is coupled to the junction between condensers 13 and resistor 14, through the coil 47 and the condenser 48. This arrangement renders the cathode follower much more effective so that a greater frequency swing is provided in applications in which this is desirable.

Figure 5:
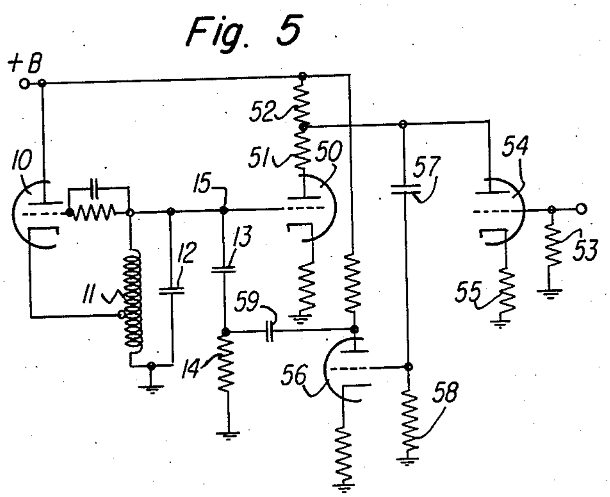
Fig. 5 illustrates a further embodiment of the invention.

A further embodiment of the invention is shown in Fig. 5 of the drawings. The oscillator illustrated is the same as in the previous figures with the voltage from the point 15 being applied to the grid of a triode tube 50 which serves as an amplifier. The plate load of the tube 50 is made up of two resistors 51 and 52 connected in series, which divide the output signal from the tube 50. The modulating signal is applied through resistor 53 to the grid of a triode tube 54. The plate of this tube is connected to the junction between resistors 51 and 52 and the cathode is connected to ground through resistor 55. In this arrangement the modulating signal applied to the tube 54 is effective to change the plate resistance of this tube so that the effective ratio of the voltage divider formed by resistors 51 and 52 is changed. This controls the gain of the amplifier tube 50 to thereby change the frequency of the oscillator 10 as previously described.

The output of the amplifier tube 50 is applied to the triode 56 which is generally equivalent to the triode 22 of Fig. 1 and reverses the phase of the voltage applied to the lower terminal of the condenser 13. This circuit is completed through coupling condenser 57 and resistor 58 between the tubes 50 and 56, and the coupling condenser 59 which is connected from the plate of the triode 56 to the junction between condenser 13 and resistor 14. This system may be used in the same manner as the system of Fig. 2 in that any desired modulating voltage may be applied such as audio modulation or any other variable signal.

In the foregoing a variable frequency oscillator circuit has been described in which the reactive effect of a condenser that is electrically connected to the oscillating circuit may be electrically controlled to vary the frequency of the oscillator signal produced thereby. The control of the reactive effect of the condenser is obtained in such manner that the reactive effect of the frequency controlling condenser in the oscillating circuit may be reduced, completely eliminated or even reversed even though the condenser is at all times electrically connected thereto.

It should be obvious that various circuit arrangements for controlling the reactive effect of the frequency changing condenser on the oscillating circuit may be used, and that various modifications may be made within the spirit of the invention and the scope of the appended claims.

I claim:

1. In a frequency modulated oscillator circuit for producing a carrier wave having a center frequency which is modulated to produce frequencies greater than and less than the center frequency, and which circuit includes an electron valve and a resonant oscillator circuit, apparatus for controlling the signal frequency of the oscillator circuit including in combination, series connected condenser means and impedance means connected in parallel with said resonant circuit, with the oscillator signal voltage being applied to one electrode of said condenser means, an amplifier having first and second stages each of which inverts the signal applied thereto, said stages being connected in cascade with said first stage having an input electrode connected to said one electrode of said condenser means and said second stage having an output electrode connected to the other electrode of said condenser means, said amplifier applying a signal voltage of the same phase as the oscillator signal voltage to said other electrode of said condenser means, said amplifier having a maximum gain greater than unity and including gain controlling means to control the amplitude of the signal applied to said other electrode to thereby control the reactive effect of said condenser means on said resonant circuit and control the frequency of the oscillator circuit, said amplifier having a gain of substantially unity for producing the center frequency determined by the resonant oscillator circuit, said amplifier being controlled to have gains greater than and less than unity to provide frequencies greater than and less than said center frequency.

2. Control apparatus as recited in claim 1 wherein said second amplifier stage includes an input electrode, and including an audio transformer having a primary winding adapted to be connected to a source of modulation signals and a secondary winding connected to said input electrode of said second amplifier stage for controlling the gain thereof.

References Cited in the file of this patent

UNITED STATES PATENTS

| | | |
|---|---|---|
| 2,341,243 | Schock | Feb. 8, 1944 |
| 2,349,811 | Crosby | May 30, 1944 |
| 2,691,106 | Woodbury | Oct. 5, 1954 |